(12) United States Patent
Tanzawa

(10) Patent No.: US 9,177,614 B2
(45) Date of Patent: *Nov. 3, 2015

(54) APPARATUSES AND METHODS INCLUDING MEMORY WITH TOP AND BOTTOM DATA LINES

(71) Applicant: Micron Technology, Inc., Boise, ID (US)

(72) Inventor: Toru Tanzawa, Adachi (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/444,589

(22) Filed: Jul. 28, 2014

(65) Prior Publication Data

US 2014/0334219 A1 Nov. 13, 2014

Related U.S. Application Data

(63) Continuation of application No. 13/335,814, filed on Dec. 22, 2011, now Pat. No. 8,792,263.

(51) Int. Cl.
*G11C 5/06* (2006.01)
*G11C 5/02* (2006.01)
*H01L 27/115* (2006.01)

(52) U.S. Cl.
CPC ............... *G11C 5/063* (2013.01); *G11C 5/025* (2013.01); *H01L 27/11556* (2013.01); *H01L 27/11582* (2013.01)

(58) Field of Classification Search
CPC ....... G11C 5/025; G11C 7/18; G11C 11/4097

USPC ................. 365/72, 185.17, 185.18, 185.03
See application file for complete search history.

(56) References Cited

U.S. PATENT DOCUMENTS

| 5,206,183 | A | 4/1993 | Dennison |
| 5,345,563 | A | 9/1994 | Uihlein et al. |
| 5,828,621 | A | 10/1998 | Tanzawa et al. |
| 6,118,696 | A | 9/2000 | Choi |
| 6,551,857 | B2 | 4/2003 | Leedy |
| 6,594,168 | B2 | 7/2003 | Keeth et al. |
| 6,643,159 | B2 | 11/2003 | Fricke et al. |
| 6,747,305 | B2 | 6/2004 | Forbes et al. |
| 7,606,059 | B2 | 10/2009 | Toda |
| 7,821,865 | B2 | 10/2010 | Choi et al. |
| 8,097,504 | B2 | 1/2012 | Mokhlesi et al. |
| 8,116,149 | B2 | 2/2012 | Chen et al. |
| 8,278,170 | B2 | 10/2012 | Lee et al. |

(Continued)

OTHER PUBLICATIONS

Cernea, Raul, et al., "A 34MB/s-Program-Throughput 16Gb MLC NAND with All-Bitline Architecture in 56nm", ISSCC Session 23.1, Non-Volatile Memory, (Feb. 2008), 420-421, 624.

(Continued)

*Primary Examiner* — Connie Yoha
(74) *Attorney, Agent, or Firm* — Schwegman Lundberg & Woessner, P.A.

(57) ABSTRACT

Some embodiments include apparatuses and methods having a first set of data lines, a second set of data lines, and memory cells located in different levels of the apparatus. In at least one of such embodiments, the memory cells can be arranged in memory cell strings between the first and second set of data lines. Other embodiments including additional apparatuses and methods are described.

21 Claims, 11 Drawing Sheets

(56) References Cited

U.S. PATENT DOCUMENTS

| | | | |
|---|---|---|---|
| 8,383,482 B2 | 2/2013 | Kim et al. | |
| 8,395,190 B2 | 3/2013 | Shim et al. | |
| 8,593,869 B2 | 11/2013 | Tanzawa | |
| 8,780,631 B2 | 7/2014 | Tanzawa | |
| 8,792,263 B2 * | 7/2014 | Tanzawa | 365/72 |
| 2010/0012997 A1 | 1/2010 | Jang et al. | |
| 2010/0271885 A1 | 10/2010 | Scheuerlein et al. | |
| 2011/0002178 A1 * | 1/2011 | Hwang et al. | 365/189.011 |
| 2011/0115010 A1 | 5/2011 | Shim et al. | |
| 2011/0205776 A1 | 8/2011 | Murata | |
| 2012/0003828 A1 * | 1/2012 | Chang et al. | 438/591 |
| 2012/0047321 A1 | 2/2012 | Yoon et al. | |
| 2012/0051137 A1 | 3/2012 | Hung et al. | |
| 2012/0068259 A1 | 3/2012 | Park et al. | |
| 2012/0147651 A1 | 6/2012 | Scheuerlein et al. | |
| 2012/0182804 A1 * | 7/2012 | Hung et al. | 365/185.13 |
| 2013/0028023 A1 | 1/2013 | Tanzawa | |
| 2013/0028024 A1 | 1/2013 | Tanzawa | |
| 2013/0148427 A1 | 6/2013 | Lee | |
| 2013/0163305 A1 | 6/2013 | Tanzawa | |
| 2014/0056049 A1 | 2/2014 | Tanzawa | |
| 2014/0063941 A1 * | 3/2014 | Hara | 365/185.03 |
| 2014/0078827 A1 | 3/2014 | Tanzawa | |
| 2014/0321188 A1 | 10/2014 | Tanzawa | |

OTHER PUBLICATIONS

Chiang, M H, "Novel High-Density Low-Power Logic Circuit Techniques Using DG Devices", IEEE ED, 52(10), (Oct. 2005), 2339-42.

Crowley, Matthew, et al., "512 Mb PROM with 8 Layers of Antifuse/Diode Cells", IEEE International Solid-State Circuits Conference 2003 Digest of Papers, (Feb. 11, 2003), 284-293.

Jang, J., et al., "Vertical cell array using TCAT(Terabit Cell Array Transistor) technology for ultra high density NAND flash memory", Symposium on VLSI Technology, (2009), 192-193.

Johnson, Mark, et al., "512-Mb PROM with a Three-Dimensional Array of Diode/Antifuse Memory Cells", IEEE Journal of Solid-State Circuits, vol. 38, No. 11, (Nov. 2003), 1920-1928.

Katsumata, R, et al., "Pipe-shaped BiCS flash memory with 16 stacked layers and multi-level-cell operation for ultra high density storage devices", Symposium on VLSI Technology, (Jun. 2009), 136-37.

Kim, J, et al., "Novel Vertical-Stacked Array-Transistor (VSAT) for ultra-high-density and cost-effective NAND Flash memory devices and SSD (Solid State Drive)", Symposium on VLSI Technology, (2009), pp. 186-187.

Kim, W, et al., "Multi-layered Vertical Gate NAND Flash overcoming stacking limit for terabit density storage", Symposium on VLSI Technology, (Jun. 2009), 188-89.

Sakui, K, et al., "Design Impacts on NAND Flash Memory Core Circuits with Vertical MOSFETs", IEEE International Memory Workshop (IMW), (May 2010), 4 pgs.

Tanaka, T., et al., "A quick intelligent page-programming architecture and a shielded bitline sensing method for 3 V-only NAND flash memory", IEEE Journal of Solid-State Circuits, 29(11), (Nov. 1994), 1366-1373.

Tanzawa, T., et al., "Circuit techniques for a 1.8-V-only NAND flash memory", IEEE Journal of Solid-State Circuits, 37(1), (Jan. 2002), 84-89.

* cited by examiner

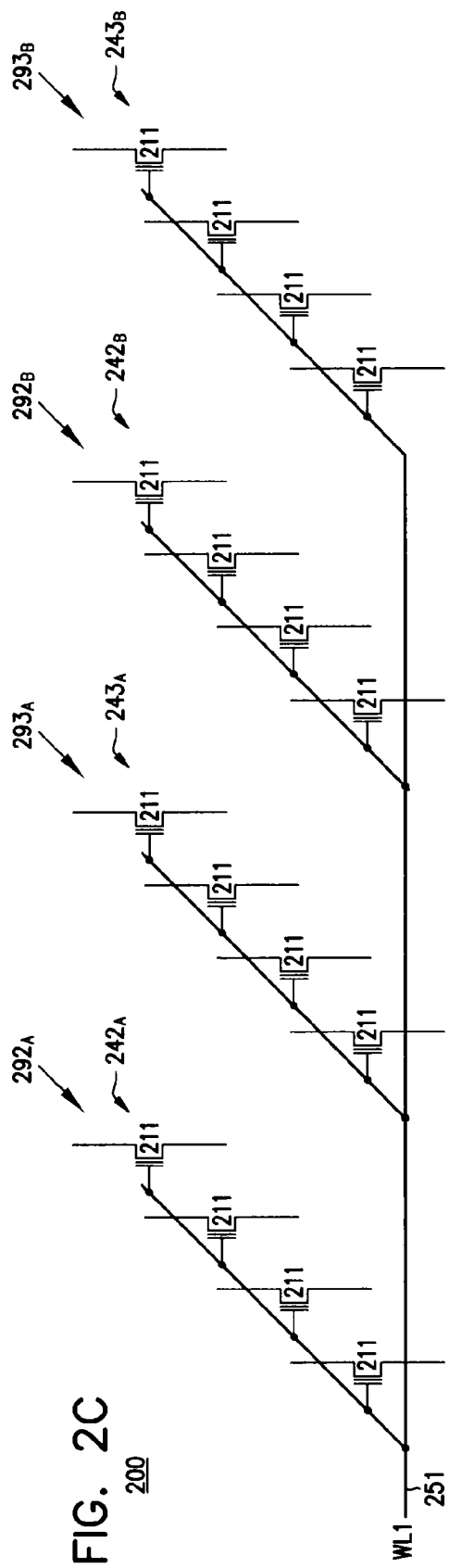
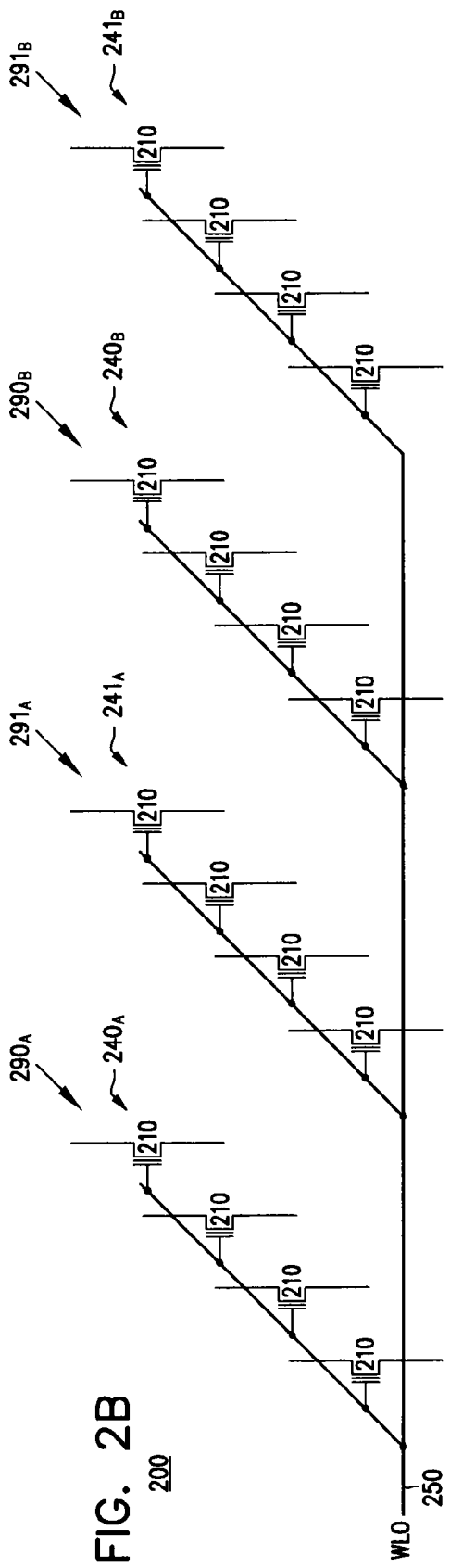
FIG. 2C 200
FIG. 2B 200

200

200

300

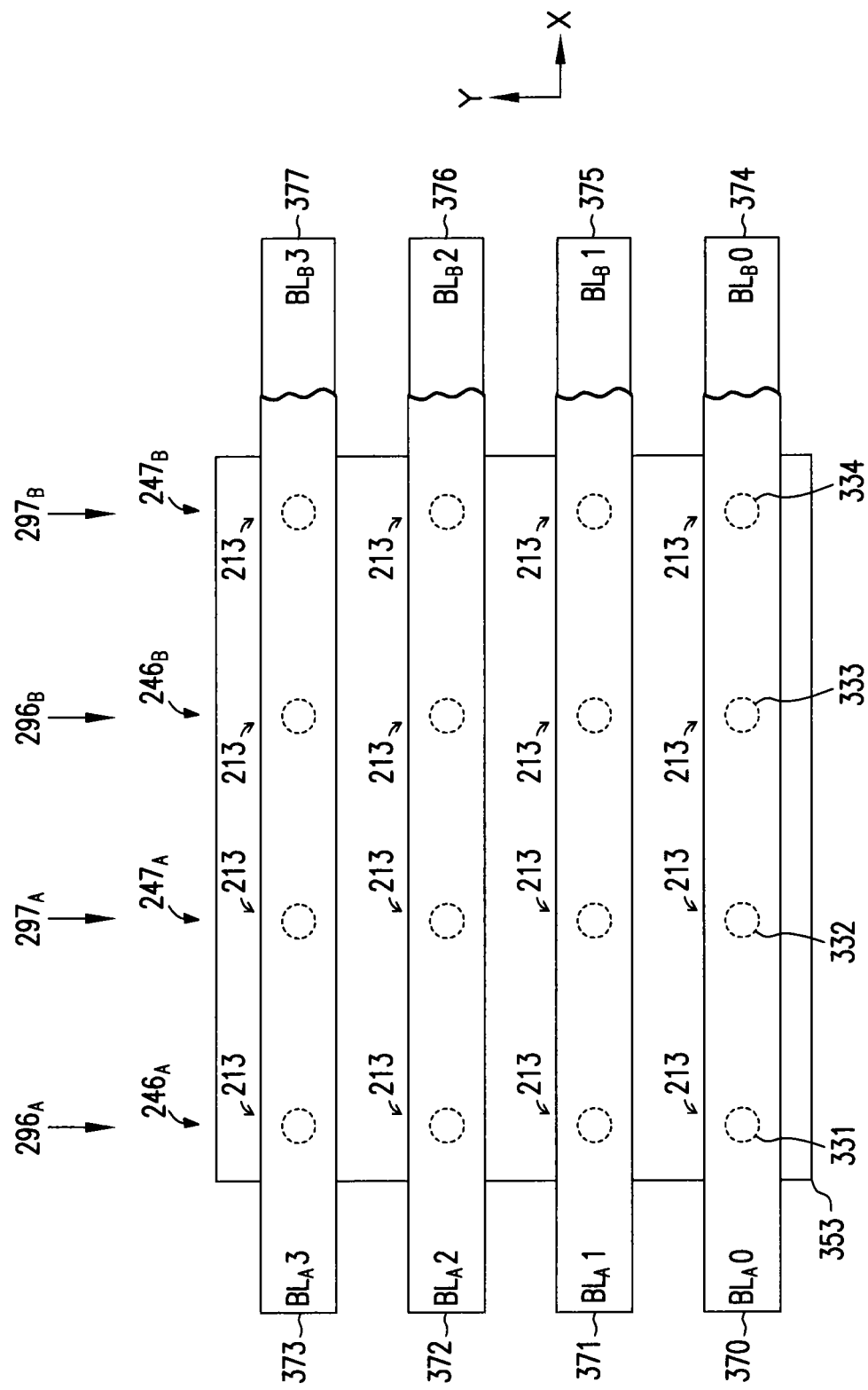

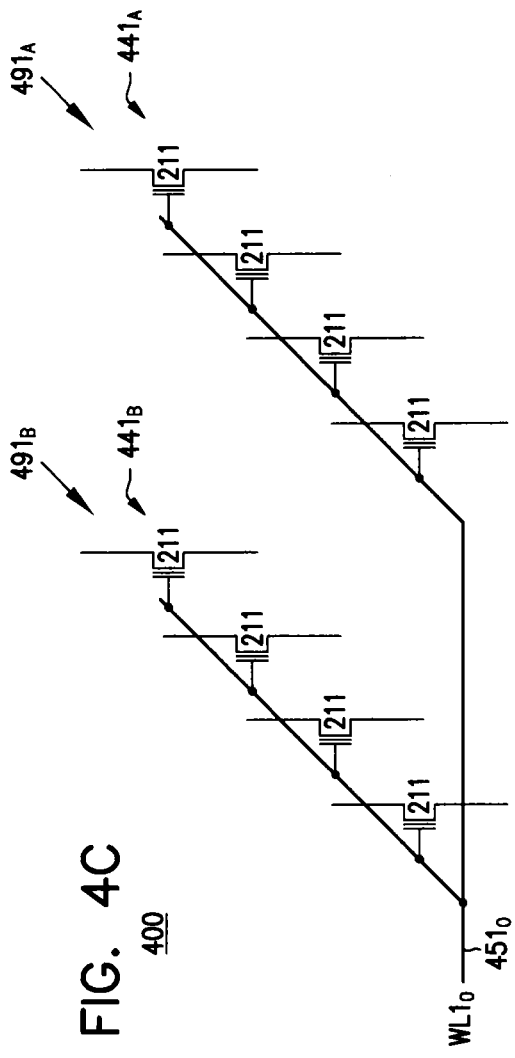
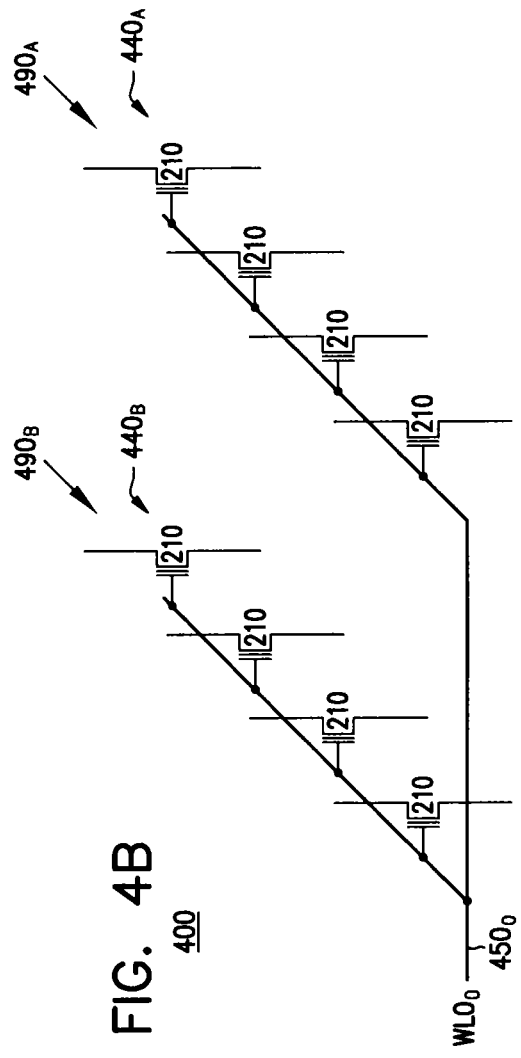

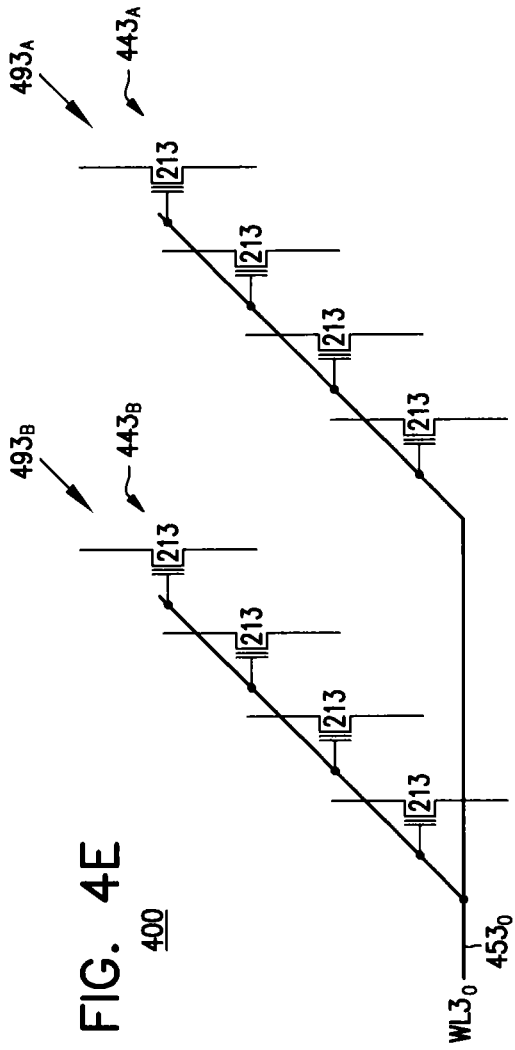
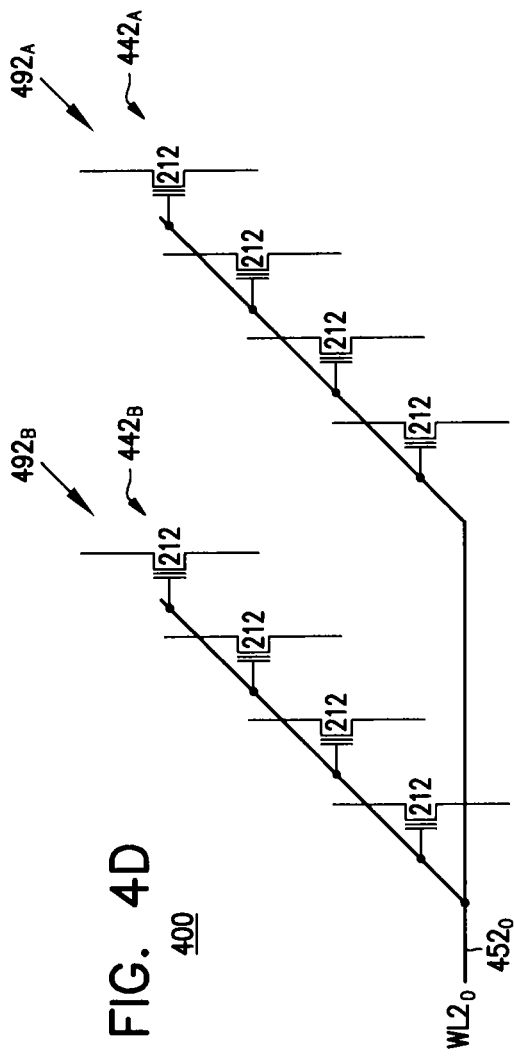
FIG. 4E
400
FIG. 4D
400

500

APPARATUSES AND METHODS INCLUDING MEMORY WITH TOP AND BOTTOM DATA LINES

PRIORITY APPLICATION

This application is a continuation of U.S. application Ser. No. 13/335,814, filed Dec. 22, 2011, which is incorporated herein by reference in its entirety.

BACKGROUND

Memory devices are often used to store information in many products such as computers, digital televisions, digital cameras, cellular phones, and other electronic products. Such memory devices usually have numerous memory cells and associated data lines to exchange information with the memory cells. In these memory devices, controlling some parameters (e.g., speed) associated with information being stored into or retrieved from a given number of memory cells may pose challenges.

BRIEF DESCRIPTION OF THE DRAWINGS

FIG. 2B, FIG. 2C, FIG. 2D, and FIG. 2E repeat specific portions including memory cell sets of the memory device of FIG. 2A, according to an embodiment of the invention.

FIG. 3B shows a top view of the structure of memory device of FIG. 3A, according to an embodiment of the invention.

FIG. 4B, FIG. 4C, FIG. 4D, and FIG. 4E repeat specific portions including memory cell sets of the memory device of FIG. 4A, according to an embodiment of the invention.

DETAILED DESCRIPTION

Figure 1:
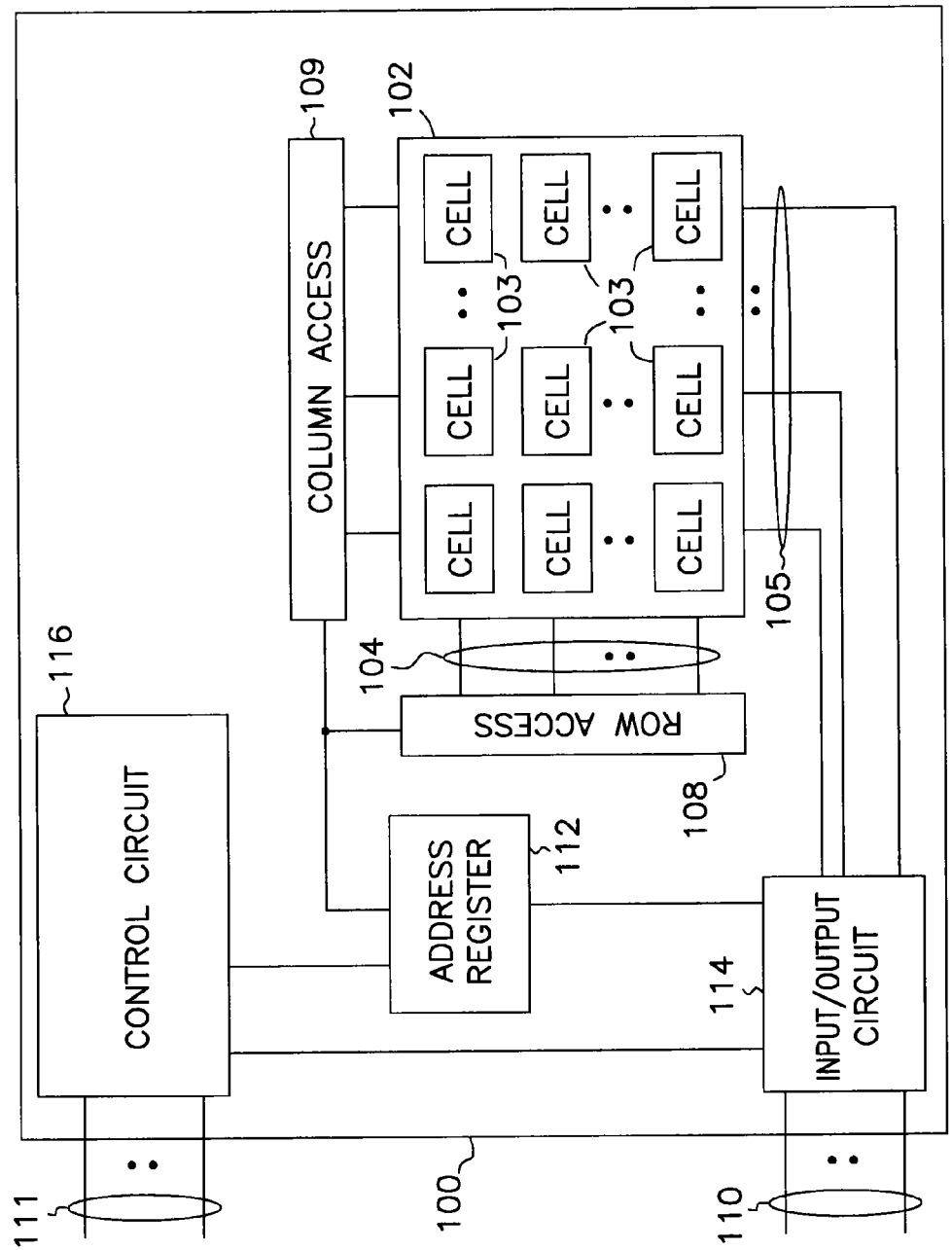
FIG. 1 shows a block diagram of an apparatus in the form of a memory device, according to an embodiment of the invention.

FIG. 1 shows a block diagram of an apparatus in the form of a memory device 100, according to an embodiment of the invention. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103. The information can include data (e.g., bits of data). The information can include data and other information (e.g., other bits) associated with the data. For example, the information can also include data and error correction code associated with the data.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control circuit 116 can control operations of memory device 100 based on signals present on lines 110 and 111. A device (e.g., a processor or a memory controller) external to memory device 100 can send different commands (e.g., read, write, or erase commands) to memory device 100 using different combinations of signals on lines 110, 111, or both.

Memory device 100 can respond to commands to perform memory operations on memory cells 103, such as performing a read operation to read information from memory cells 103 or performing a write (e.g., programming) operation to store (e.g., program) information into memory cells 103. Memory device 100 can also perform an erase operation to clear information from some or all of memory cells 103.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00," "01," "10," and "11" of two bits, one of eight possible values "000," "001," "010," "011," "100," "101," "110," and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power is disconnected from memory device 100. For example, memory device 100 can be a flash memory device, such as a NAND flash or a NOR flash memory device, or another kind of memory device, such as a variable resistance memory device (e.g., a phase change or resistive RAM device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100.

One of ordinary skill in the art may recognize that memory device 100 may include other elements, several of which are not shown in FIG. 1, so as not to obscure the example embodiments described herein.

At least a portion of memory device 100 can include structures similar to or identical to memory devices described below with reference to FIG. 2A through FIG. 5B.

Figure 2A:
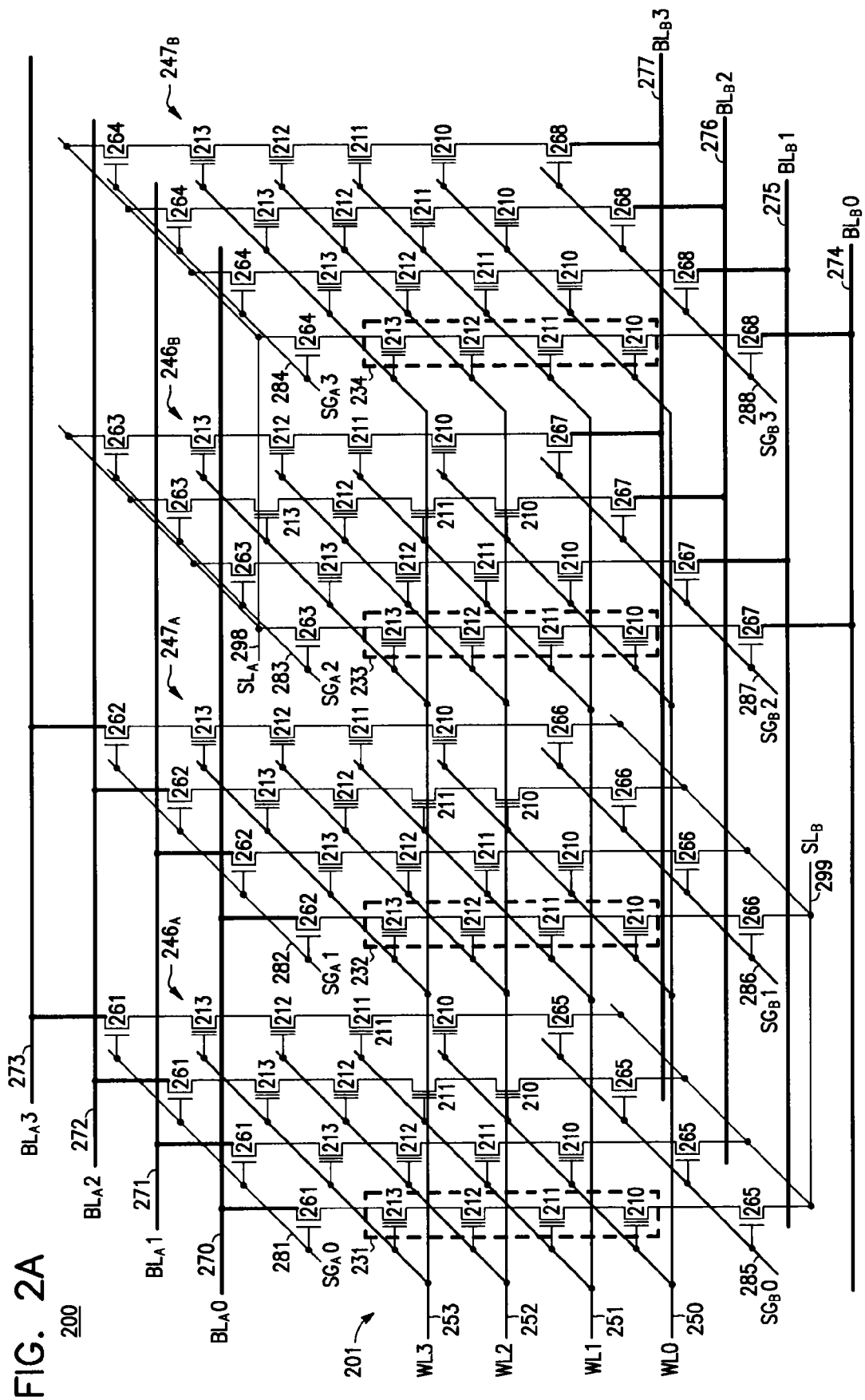
FIG. 2A shows a schematic diagram of a portion of a memory device having data lines, according to an embodiment of the invention.

FIG. 2A shows a schematic diagram of a portion of a memory device 200 having lines 270, 271, 272, 273, 274, 275, 276, and 277, according to an embodiment of the invention. Lines 270, 271, 273, and 273 can form a set of data lines (e.g., top data lines) of memory device 200 and can carry signals $BL_A0$, $BL_A1$, $BL_A2$, and $BL_A3$, respectively. Lines 274, 275, 276, and 277 can form another set of data lines (e.g., bottom data lines) of memory device 200 and can carry signals $BL_B0$, $BL_B1$, $BL_B2$, $BL_B3$, respectively.

Memory device 200 can include lines 250, 251, 252, and 253 that can carry corresponding signals WL0, WL1, WL2, and WL3. Each of lines 250, 251, 252, and 253 can form part of a respective access line of memory device 200. FIG. 2A shows four lines 250 through 253 and eight lines 270 through 277 as an example. The number of such lines can vary.

Memory device 200 can include a memory cell group 201 having memory cells 210, 211, 212, and 213, and transistors (e.g., select transistors) 261, 262, 263, 264, 265, 266, 267, and 268. Memory cells 210, 211, 212, and 213 can be arranged in memory cell strings, such as memory cell strings 231, 232, 233, and 234. For simplicity, only four (231, 232, 233, and 234) of the 16 memory cell strings in FIG. 2A are labeled.

Each memory cell string in memory device 200 can be coupled to two associated transistors among transistors 261 through 268. For example, memory cell string 231 can be coupled to transistor 261 (directly over string 231) and transistor 265 (directly under string 231).

FIG. 2A shows an example of 16 memory cell strings and four memory cells 210, 211, 212, and 213 in each memory cell string. The number of such memory cell strings and number of memory cells in each memory cell string can vary.

As shown in FIG. 2A, memory device 200 can include lines 281, 282, 283, and 284 coupled to gates of transistors 261, 262, 263, and 264, respectively. Lines 281, 282, 283, and 284 can form part of select lines of memory device 200 and can carry signals $SG_A0$, $SG_A1$, $SG_A2$, and $SG_A3$ (e.g., top select gate signals), respectively.

Memory device 200 can include lines 285, 286, 287, and 288 coupled to gates of transistors 265, 266, 276, and 268, respectively. Lines 285, 286, 287, and 288 can form part of select lines of memory device 200 and can carry signals $SG_B0$, $SG_B1$, $SG_B2$, and $SG_B3$ (e.g., bottom select gate signals), respectively.

Transistors 261, 262, 263, and 264 can be controlled (e.g., turned on or turned off) by signals $SG_A0$, $SG_A1$, $SG_A2$, and $SG_A3$, respectively. Transistors 265, 266, 276, and 268 can be controlled (e.g., turned on or turned off) by $SG_B0$, $SG_B1$, $SG_B2$, and $SG_B3$ signals, respectively.

Memory device 200 can include line 298 coupled to transistors 263 and 264 and line 299 coupled to transistors 265 and 266. Lines 298 and 299 can carry signals $SL_A$ and $SL_B$ (e.g., source line signals). Each of lines 298 and 299 can form part of a respective source (e.g., a respective source line) of memory device 200.

FIG. 2B, FIG. 2C, FIG. 2D, and FIG. 2E repeat specific portions of the memory device of FIG. 2A, including memory cell sets formed by memory cells 210, 211, 212, and 213. As shown in FIG. 2A through FIG. 2E, memory cells 210, 211, 212, and 213 can be arranged in memory cells sets in rows, such that each of the memory cell sets can be included in a different row. For example, in FIG. 2B, memory cells 210 can be arranged in four memory cell sets $240_A$, $241_A$, $240_B$, and $241_B$ in four rows $290_A$, $291_A$, $290_B$, and $291_B$, respectively. Memory cell sets $240_A$, $241_A$, $240_B$, and $241_B$ can share (e.g., directly coupled to) the same line 250.

In FIG. 2C, memory cells 211 can be arranged in four memory cell sets $242_A$, $243_A$, $242_B$, and $243_B$ in four rows $292_A$, $293_A$, $292_B$, and $293_B$, respectively. Memory cell sets $242_A$, $243_A$, $242_B$, and $243_B$ can share (e.g., directly coupled to) the same line 251.

Figure 2E:
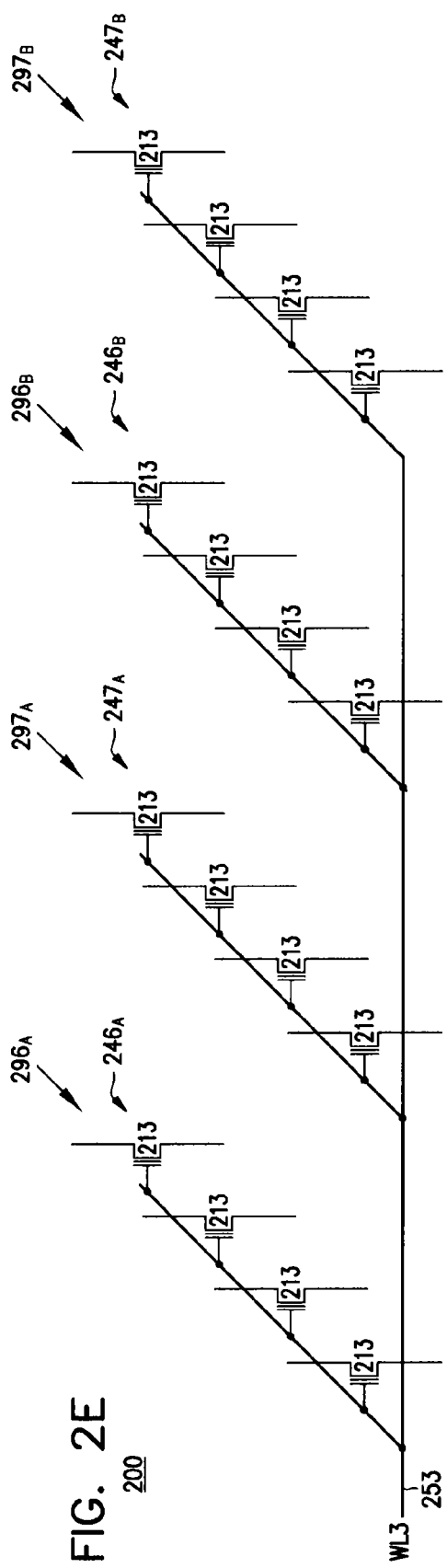
Figure 2D:
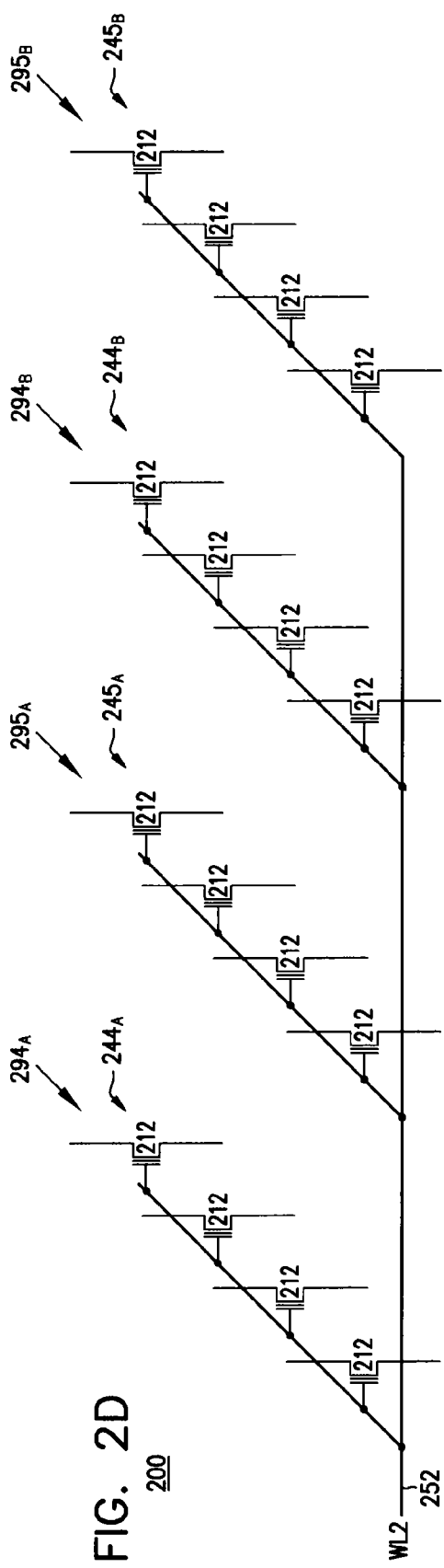

In FIG. 2D, memory cells 212 can be arranged in four memory cell sets $244_A$, $245_A$, $244_B$, and $245_E$ in four rows $294_A$, $295_A$, $294_B$, and $295_B$, respectively. Memory cell sets $244_A$, $245_A$, $244_B$, and $245_E$ can share (e.g., directly coupled to) the same line 252.

In FIG. 2E, memory cells 213 can be arranged in four memory cell sets $246_A$, $247_A$, $246_B$, and $247_B$ in four rows $296_A$, $297_A$, $296_B$, and $297_B$, respectively. Memory cell sets $246_A$, $247_A$, $246_B$, and $247_B$ can share (e.g., directly coupled to) the same line 253.

Each of the memory cell sets can include four memory cells from four different memory cell strings. For example, as shown in FIG. 2A, memory cell set $246_A$ can include four memory cells 213 from four different memory cell strings (including memory cell string 231) that are coupled between transistors 261 and 265.

FIG. 2A shows an example of memory cell group 201 having 64 memory cells arranged in 16 memory cell sets where each of the memory cell sets can include four memory cells. The number of memory cell sets and the number of memory cells in each memory cell set (or, for that matter, the number of cells in any other grouping, such as memory cell strings) can vary.

The memory cell sets in memory device 200 (FIG. 2A through FIG. 2E) can be configured such that multiple memory cell sets can be selected (e.g., concurrently selected) in a memory operation (e.g., read or write operation). For example, two memory cell sets in different rows sharing the same access line can be selected in a memory operation. A selected memory cell set refers to the memory cell set that is selected to be accessed in a memory operation, so that memory device 200 can (e.g., in a write operation) store information into memory cells in the selected memory cell set or retrieve (e.g., in a read operation) stored information from memory cells in the selected memory cell sets.

Information can be concurrently stored into memory cells of the selected memory cell sets (e.g., two selected memory cell sets in different rows) in a write operation. In other words, in a write operation, information can be stored into the selected memory cell sets in a parallel fashion. For example, in FIG. 2A (also FIG. 2E), memory cell sets $246_A$, and $246_B$ in respective rows $296_A$ and $296_B$ can be selected in a write operation in order to concurrently store information into them. Since memory cell sets $246_A$ and $246_B$ include eight memory cells 213 (four in each memory cell set), eight bits of information can be concurrently stored into memory cell sets $246_A$ and $246_B$ when these two memory cell sets are selected. Four of the eight bits of information can be stored into four respective memory cells 213 in memory cell set $246_A$ while another four of the eight bits of information can be stored into memory cells 213 of memory cell set $246_B$. If each of memory cells 210, 211, 212, and 213 of memory device 200 is configured to store multiple bits of information (e.g., two bits per memory cell), then another eight bits of information (e.g., another page of information) can be concurrently stored into memory cell sets $246_A$ and $246_B$ after the first eight bits of information are stored, such that a total of 16 bits of information can be stored in memory cell sets $246_A$ and $246_B$.

Information to be stored into four respective memory cells 213 of memory cell set $246_A$ can be based on the values (e.g., voltage or current values) of signals in memory device 200, including signals WL3, $BL_A0$, $BL_A1$, $BL_A2$, and $BL_A3$ (associated with lines 270, 271, 272, and 273, respectively). Information to be stored into memory cells 213 of memory cell set $246_B$ can be based on the values of signals WL3, $BL_B0$, $BL_B1$, $BL_B2$, and $BL_B3$ (associated with lines 253, 274, 275, 276, and 277, respectively).

Information can be concurrently retrieved from memory cells of the selected memory cell sets (e.g., two selected memory cell sets in different rows) in a read operation. In other words, in a read operation, information can be retrieved from the selected memory cell sets in a parallel fashion. For example, in FIG. 2A (also FIG. 2E), memory cell sets $246_A$ and $246_B$ can be selected in a read operation in order to retrieve information from them. In this example, since memory cell sets $246_A$ and $246_B$ include eight memory cells 213, eight bits of information can be concurrently retrieved from memory cell sets $246_A$ and $246_B$. Four of the eight bits of information can be retrieved from four respective memory cells 213 in memory cell set $246_A$ while another four of the eight bits of information can be retrieved from four respective memory cells 213 of memory cell set $246_B$. If each of memory cells 210, 211, 212, and 213 of memory device 200 is configured to store multiple bits of information (e.g., two bits per memory cell), then more than eight bits (e.g., 16 bits) of information can be retrieved from memory cell sets $246_A$ and $246_B$.

Information retrieved from memory cells 213 of memory cell set $246_A$ can be based on the values (e.g., voltage or current values) of signals $BL_A0$, $BL_A1$, $BL_A2$, and $BL_A3$ (associated with lines 270, 271, 272, and 273, respectively). Information retrieved from memory cells 213 of memory cell set $246_B$ can be based on the values of signals $BL_B0$, $BL_B1$, $BL_B2$, and $BL_B3$ (associated with lines 274, 275, 276, and 277, respectively).

In a write operation, memory device 200 (FIG. 2A) can selectively turn on transistors 261 through 268 located between selected memory cell strings and lines 270 through 277. This enables selected memory cell sets included in the selected memory cell strings to be coupled to respective lines among lines 270 through 277, so that information can be stored into respective memory cells of the selected memory cell sets based on values of signals on lines 270 through 277 (e.g., signals $BL_A0$, $BL_A1$, $BL_A2$, $BL_A3$ $BL_B0$, $BL_B1$, $BL_B2$, and $BL_B3$, respectively).

Selected memory cell strings refer to the memory cell strings that include memory cells in the selected memory cell sets. For example, in the example write operation described above where memory cell sets $246_A$ and $246_B$ are selected, four memory cell strings (including memory cell string 231) located between transistors 261 and lines 270, 272, 272, and 273 can be selected memory cell strings. Four memory cell strings (including memory cell string 233) located between transistors 267 and lines 274, 275, 276, and 277 can also be selected memory cell strings. Thus, in the above example write operation, memory device 200 can turn on transistors 261 and 267 by, for example, providing appropriate voltages to signals $SG_A0$ and $SG_B2$, respectively.

In a write operation, memory device 200 (FIG. 2A) can selectively turn off transistors 261 through 268 located between selected memory cell strings and lines 298 and 299. Thus, in the above example write operation, memory device 200 can turn off transistors 263 and 265 by, for example, providing appropriate voltages (e.g., zero volts) to signals $SG_A2$ and $SG_B0$, respectively. In a write operation, memory device 200 can also turn off transistors that are associated with unselected memory cell strings. Unselected memory cell strings refer to the memory cell strings that have no memory cells included in selected memory cell sets. For example, in the example write operation described above where memory cell sets $246_A$ and $246_B$ are selected, four memory cell strings (including memory cell string 232) located between transistors 262 and 266 can be unselected memory cell strings. Four memory cell strings (including memory cell string 234) located between transistors 264 and 268 can also be unselected memory cell strings. Thus, in the above example write operation, memory device 200 can turn off transistors 262, 264, 266, and 268 by, for example, providing appropriate voltages to signals $SG_A1$, $SG_B3$, $SG_B1$, and $SG_B3$, respectively.

In a read operation, memory device 200 (FIG. 2A) can selectively turn on transistors 261 through 268 located between selected memory cell strings and lines 270 through 277 and transistors located between selected memory cell strings and lines 298 and 299. This enables selected memory cell sets included in the selected memory cell strings to be coupled to respective lines among lines 270 through 277 and among lines 298 and 299, so that information can be retrieved from respective memory cells of the selected memory cell sets based on values of signals on lines 270 through 277 (e.g., signals $BL_A0$, $BL_A1$, $BL_A2$, $BL_A3$ $BL_B0$, $BL_B1$, $BL_B2$, and $BL_B3$, respectively). Thus, in the above example read operation described above where memory cell sets $246_A$ and $246_B$ are selected, memory device 200 can turn on transistors 261, 263, 265, and 267 by, for example, providing appropriate voltages to signals $SG_A0$, $SG_A2$, $SG_B0$, and $SG_B2$, respectively.

In a read operation, memory device 200 (FIG. 2A) can turn off transistors that are associated with unselected memory cell strings. For example, in the example read operation described above where memory cell sets $246_A$ and $246_B$ are selected, memory device 200 can turn off transistors 262, 264, 266, and 268 because these transistors are associated with unselected strings.

Table 1 shows example values for the signals of memory device 200 in FIG. 2A where memory cell sets $246_A$ and $246_B$ are selected in read and write operations and all of the memory cell sets in memory cell group 201 are selected in an erase operation.

TABLE 1

| | Read memory cell sets $246_A$ and $246_B$ are selected | Write memory cell sets $246_A$ and $246_B$ are selected | Erase memory cell group 201 (all memory cell sets in group 201) |
|---|---|---|---|
| $BL_A0$ | Vbl | V1 | float |
| $BL_A1$ | Vbl | V2 | float |
| $BL_A2$ | Vbl | V3 | float |
| $BL_A2$ | Vbl | V4 | float |
| $BL_B0$ | Vbl | V5 | float |
| $BL_B1$ | Vbl | V6 | float |
| $BL_B2$ | Vbl | V7 | float |
| $BL_B3$ | Vbl | V8 | float |
| WL3 | Vread | Vpgm | 0 |
| WL2 | Vpass | Vpass | 0 |
| WL1 | Vpass | Vpass | 0 |
| WL0 | Vpass | Vpass | 0 |
| $SG_A0$ | Vsg_on1 | Vsg_on2 | Verase |
| $SG_A1$ | 0 | 0 | Verase |
| $SG_A2$ | Vsg_on1 | 0 (or float) | Verase |
| $SG_A3$ | 0 | 0 | Verase |
| $SG_B0$ | Vsg_on1 | 0 (or float) | Verase |
| $SG_B1$ | 0 | 0 | Verase |
| $SG_B2$ | Vsg_on1 | Vsg_on2 | Verase |
| $SG_B3$ | 0 | 0 | Verase |
| $SL_A$ | 0 | 0 | Verase |
| $SL_B$ | 0 | 0 | Verase |

In Table 1, voltage Vbl can have a positive value, such as a value of approximately one volt or can have a value approximately equal to the value of the supply voltage (e.g., Vcc) of memory device 200. In an initial time interval (e.g., precharge time interval) of a read operation, lines 270 through 277 (FIG. 2A) can be coupled to voltage Vbl in order to charge (e.g., precharge) lines 270 through 277 to a voltage approximately equal to the value of voltage Vbl (e.g., one volt or alternatively Vcc). Then, in another time interval after the initial time interval when the selected memory cell sets $246_A$ and $246_B$ are accessed, lines 270 through 277 can be decoupled from voltage Vbl. In this example, after lines 270 through 277 are decoupled from voltage Vbl, memory device 200 can sense signals $BL_A0$, $BL_A1$, $BL_A2$, $BL_A3$, $BL_B0$, $BL_B1$, $BL_B2$, and $BL_B3$ on lines 270, 271, 272, 273, 274, 275, 276, and 277, respectively, to determine the value of information stored in the memory cells of selected memory cell sets $246_A$ and $246_B$. In a read operation, memory device 200 can concurrently sense signals $BL_A0$, $BL_A1$, $BL_A2$, $BL_A3$, $BL_B0$, $BL_B1$, $BL_B2$, and $BL_{B3}$.

Voltage Vpass in Table 1 can have a value that can enable unselected memory cells of the selected memory cell strings to operate as pass elements to form a conductive path through each of those unselected memory cells. In the example shown in Table 1, unselected memory cells of the selected memory cell strings include memory cells 210, 211, and 212 in memory cell strings located between transistors 261 and 265. Voltage Vpass can have a value of approximately five volts.

Voltage Vread can have a value based on the range of the states (e.g., threshold voltage value range) of memory cells 210, 211, 212, and 213. As an example, voltage Vread can have a value from zero to approximately five volts when the range of the states of memory cells 210, 211, and 212 is between zero (or below zero) and five volts.

Voltage Vpgm can have a value that can enable memory device 200 to concurrently store information into memory cells in the selected memory cell sets (e.g., portions $246_A$ and $246_B$). For example, Vpgm can have a value to enable memory device 200 to concurrently change the state (e.g., threshold voltage value) of memory cells in the selected memory cell sets (e.g., portions $246_A$ and $246_B$) in order to reflect the value of information stored in the selected memory cells. Voltage Vpgm can have an example value of approximately 15 volts to 18 volts.

Each of voltages V1 through V8 can be either an enable voltage (e.g., 0V) or an inhibit voltage (e.g., Vcc). A time at which a particular data line is enabled (biased to an enable voltage, e.g., 0V) or inhibited (biased to an inhibit voltage, e.g., Vcc) corresponds to the value of the information to be stored in a memory cell coupled to that particular data line.

Voltage Vsg_on1 can have a value that can turn on transistors 261 and 265 (associated with selected memory cell strings that includes selected memory cell set $246_A$ in a read operation) and transistors 263 and 267 (associated with selected memory cell strings that include selected memory cell set $246_B$ in a read operation). For example, voltage Vsg_on1 can have a value approximately equal to the value of the supply voltage of memory device 200 (e.g., Vcc).

Voltage Vsg_on2 can have a value that can turn on transistors 261 (associated with selected memory cell set $246_A$ in a write operation) and transistors 263 (associated with selected memory cell set $246_B$ in a write operation). For example, voltage Vsg_on2 can have a value approximately equal to the value of voltage Vsg_on1. Alternatively, voltage Vsg_on2 can have a value (e.g., 2 volts) that is different from the value (e.g., 3 volts) of voltage Vsg_on1.

Voltage Verase can have a value that can clear information stored in memory cells 210, 211, 212, and 213 of memory cell group 201. For example, voltage Verase can have a value of approximately 20 volts.

In the description herein, "float" (e.g., in Table 1) refers to a situation where lines 270, 271, 272, 273, 274, 275, 276, and 277 can be uncoupled to any voltage (e.g., not coupled to ground, to a negative voltage, or to a positive voltage). In such a situation, that particular line can be considered as being in a "float" condition.

Thus, in Table 1, "float" associated with signal signals $BL_A0$, $BL_A1$, $BL_A2$, $BL_A3$, $BL_B0$, $BL_B1$, $BL_B2$, and $BL_B3$ in an erase operation refers to a situation where lines 270, 271, 272, 273, 274, 275, 276, and 277 (FIG. 2A) associated with signals $BL_A0$, $BL_A1$, $BL_A2$, $BL_A3$, $BL_B0$, $BL_B1$, $BL_B2$, and $BL_B3$ can be uncoupled to ground, to a negative voltage, or to a positive voltage in the erase operation. In this situation, lines 270, 271, 272, 273, 274, 275, 276, and 277 can be considered as being in a "float" condition.

Table 1 shows example voltage values where memory cell sets $246_A$ and $246_B$ are selected in a read or write operation. Other memory cell sets can include similar operations. For example, if memory cell sets $243_A$ and $243_B$ (FIG. 2C) are selected, then in Table 1, the voltage values of signals WL1 (associated with memory cell sets $243_A$ and $243_B$ in FIG. 2C) and WL3 (associated with portions $246_A$ and $246_B$) can be exchanged. Thus, in this example, signal WL1 can be provided with voltage Vread (in a read operation) or voltage Vpgm (in a write operation). Signal WL3 can be provided with voltage Vpass in the read and write operations.

Based on Table 1 and the connections of memory device 200 in FIG. 2, since signals $SG_A0$ and $SG_B2$ (FIG. 2A) can have the same value in read, write, or erase operation, signals $SG_A0$ and $SG_B2$ can be provided by the same signal (e.g., a single signal). In an alternative arrangement, line 281 (associated with signal $SG_A0$) and line 287 (associated with signal $SG_B2$) can be physically coupled to each other (e.g., as a same line) because they can have the same values in read and write operation.

Similarly, in a read, write, or erase operation, signals $SG_A1$ and $SG_B3$ (FIG. 2A) can have the same value. Thus, signals $SG_A1$ and $SG_B3$ can be provided by the same signal (e.g., a single signal). In an alternative arrangement, line 282 (associated with signal $SG_A1$) and line 288 (associated with signal $SG_B3$) can be physically coupled to each other (e.g., as a same line) because they can have the same values in read and write operation.

As described above, eight bits of information can be concurrently stored into or concurrently retrieved from selected memory cell sets in memory device 200 (FIG. 2A). This quantity of bits of information can be equal to the total number of memory cells (e.g., eight memory cells) included in two selected memory cell sets. Such a quantity of bits (e.g., eight bits) can be a fixed unit of information, such as page (e.g., eight bits) of information. Thus, bits in a unit (e.g., a page) of information can be concurrently stored in any two selected memory sets of memory device 200.

Memory device 200 can have a throughput (e.g., programming throughput) R defined an expression R=T/B, where B represents a quantity of bits (e.g., a page) of information to be stored (e.g., program) into the memory cells of memory device 200. T represents an amount of time it takes to store the entire quantity of bits (B) of information. For example, if it takes 40 microseconds (T=40 µs) to store eight bits (B=8) of information into the memory cells of memory device 200, then the throughput of memory device is R=40 microseconds/8 bits=5 microseconds/bit.

FIG. 2A shows memory device 200 including only one memory cell group 201 as an example. Memory device 200 can include multiple memory cell groups similar to or identical to memory cell group 201. For example, memory device 200 can include multiple memory cell groups (e.g., multiple memory blocks) where each of the multiple memory cell groups can include an equal number of memory cells (e.g., 64 memory cells as in the example of FIG. 2A or other number of memory cells).

Memory cells 210, 211, 212, and 213 can be physically located in multiple levels of memory device 200, such that memory cells 210, 211, 212, and 213 in the same memory cell string can be stacked over each other in multiple levels of memory device 200. Memory cells of different memory cell strings can also be physically located the same level of memory device 200. For example, memory cells 210 from the memory cell strings of memory device 200 can be physically located in the same level. Memory cells 211 from the memory cell strings of memory device 200 can be physically located in the same level that is over the level that memory cells 210 are located.

Memory device 200 can include structures similar to or identical to the structures of memory device 300 described below with reference to FIG. 3A and FIG. 3B.

Figure 3A:
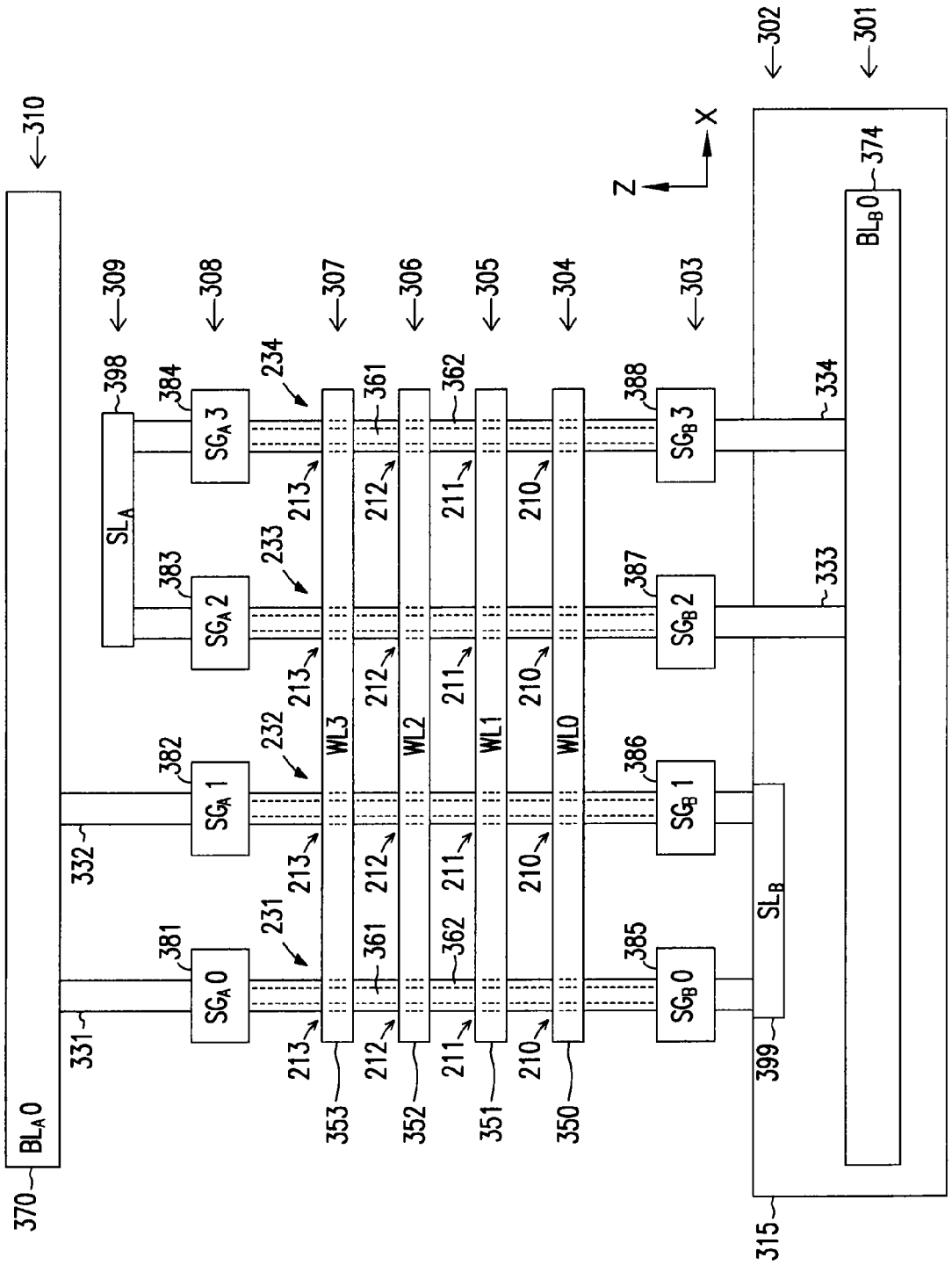
FIG. 3A shows a side view of a portion of a structure of a memory device, according to an embodiment of the invention.

FIG. 3A shows a side view of a portion of a structure of a memory device 300, according to an embodiment of the invention. FIG. 3B shows a top view of the structure of memory device 300 of FIG. 3A. Memory device 200 of FIG. 2A can include a structure similar to or identical to the structure of memory device 300 of FIG. 3A and FIG. 3B. For simplicity, detailed description and functions of similar or the same elements among FIG. 2A, FIG. 3A and FIG. 3B is not repeated in the description of FIG. 3A and FIG. 3B. For example, memory devices 200 (FIG. 2A) and 300 (FIG. 3A and FIG. 3B) can carry similar or identical signals, including $BL_A1$, $BL_A2$, $BL_A3$, $BL_B0$, $BL_B1$, $BL_B2$, $BL_B3$, WL0, WL1, WL2, WL3, $SG_A0$, $SG_A1$, $SG_A2$, $SG_A3$, $SG_B0$, $SG_B1$, $SG_B2$, $SG_B3$, $SL_A$, and $SL_B$.

As shown in FIG. 3A, memory device 300 can include a substrate 315, which can be formed from a semiconductor material, such as silicon. Memory device 300 can include different levels 301 through 310 overlying substrate 315 in a Z-direction, which is substantially perpendicular (e.g., perpendicular) to an X-direction and a Y-direction (FIG. 3B).

As shown in FIG. 3A and FIG. 3B, memory device 300 can include lines (e.g., data lines) 370, 371, 372, and 373 located on level 310. Lines 371, 372, and 373 blocked from side view in FIG. 3A but they are shown in FIG. 3B. Memory device 300 can include lines (e.g., data lines) 374, 375, 376, and 377 located on level 301. Lines 375, 376, and 377 are blocked from the side view of FIG. 3A but they are partially shown in FIG. 3B.

Lines 370, 371, 372, and 373 (FIG. 3B) can form a set of data lines (e.g., four top data lines) that can correspond to the set of data lines formed by lines 270, 271, 272, and 273 of FIG. 2A. Lines 374, 375, 376, and 377 (FIG. 3A and FIG. 3B) can form a set of data lines (e.g., four bottom data lines) that can correspond to the set of data lines formed by lines 274, 275, 276, and 277 of FIG. 2A.

Memory device 300 can include memory cells 210, 211, 212, and 213 located on device levels 304, 305, 306, and 307, respectively. Memory cells 210, 211, 212, and 213 can be arranged in memory cell strings, such as memory cell strings 231, 232, 233 and 234, between the set of data lines formed by lines 370, 371, 372, and 373 and the set of data lines formed by lines 374, 375, 376, and 377. Memory cell strings 231, 232, 233 and 234 in FIG. 3A can correspond to memory cell strings 231, 232, 233 and 234 of memory device 200 in FIG. 2A.

Memory device 300 can include lines (e.g., select lines) 381 through 388 (which can correspond to lines 281 through 288, respectively, of FIG. 2A) and lines 398 and 399 (which correspond to lines 298 and 299, respectively, of FIG. 2A). FIG. 3A shows an example where lines 381 and 387 are separated from each other. Alternatively, lines 381 and 387 can be coupled to each other (e.g., directly contacting each other) such that lines 381 and 387 can share the same signal during a memory operation.

Memory device 300 can include transistors (e.g., select transistors) associated with lines 381 through 388. For example, memory device 300 can include transistors (which can be similar to transistors 261, 262, 263, and 264 of FIG. 2A) located on level 308 and surrounded by corresponding lines 381, 382, 383, and 384, and transistors (which can be similar to transistors 265, 266, 267, and 268 of FIG. 2A) located on level 301 and surrounded by respective lines 385, 386, 387, and 388.

In FIG. 3A, line 399 can be a layer of conductive material formed on substrate 315. Alternatively, line 399 can be a doped region (e.g., conductive p-type or n-type doped region) formed in substrate 315.

Lines 374, 375, 376, and 377 (FIG. 3A and FIG. 3B) can be separate layers of conductive material formed on substrate 315. Alternatively, lines 374, 375, 376, and 377 can be separate doped regions (e.g., conductive p-type or n-type doped regions) formed in substrate 315.

Each of memory cell strings 231, 232, 233, and 234 can include a body region 361 having a length in the Z-direction. Memory device 300 can include lines 350, 351, 352, and 353 located along the length of body region 361. Lines 350, 351, 352, and 353 can correspond to lines 250, 251, 252, and 253 of FIG. 2A. Memory device 300 can include contacts 331, 332, 333, and 334 coupled between respective memory cell strings (e.g., 231, 232, 233, and 234) and lines 370 through 377.

As shown in FIG. 3A, each of memory cell strings 231, 232, 233, and 234 can also include a material 362 between body region 361 and lines 350, 351, 352, and 353. Material 362 can substantially surround body region 361. Each of lines 350, 351, 352, and 353 can substantially surround a respective cross section of body region 361. The cross section of body region 361 can have a circular shape. Body region 361 can include semiconductor material, such as silicon (e.g., doped polysilicon of p-type or n-type).

Material 362 can include material that can be configured to store information in memory cells 210, 211, 212, and 213. For example, material 362 can include charge storage material, such as a combination of a tunnel dielectric layer, a silicon oxide layer, and a charge blocking layer, or a combination of a silicon nitride layer, a polysilicon layer, and a nitride layer, or other material that can provide a charge storage function to represent a value of information stored in the memory cells of memory cells 210, 211, 212, and 213. As an example, material 362 can include a combination of a tunnel dielectric directly contacting the body region 361, a charge storage material (e.g., polysilicon floating gate) directly contacting the tunnel dielectric, and a charge blocking material directly contacting the charge storage material.

As shown in FIG. 3B, memory cells 213 (located on level 307 in FIG. 3A) can be arranged in four memory cell sets $246_A$, $247_A$, $246_B$, and $247_B$ in four rows $296_A$, $297_A$, $296_B$, and $297_B$, respectively. Memory cell sets $246_A$, $247_A$, $246_B$, and $247_B$ can share (e.g., directly coupled to) the same line 353.

Memory device 300 can perform memory operations (e.g., read, write, and erase operations) similar to those of memory device 200 described above with reference to FIG. 2A through FIG. 2E. For example, in a write operation of memory device 300 in FIG. 3B, the memory cell strings (e.g., eight memory cell strings) that include eight respective memory cells 213 in memory cell sets $246_A$ and $246_B$ can be selected to concurrently store information into those eight memory cells 213. In this example, lines 370, 371, 372, and 373 (e.g., top data lines) can be used to provide information to four memory cells 213 in memory cell set $246_A$ while lines 374, 375, 376, and 377 (e.g., bottom data lines) can be used to provide information to four memory cells 213 in memory cell set $246_B$.

In another example, in a read operation of memory device 300 in FIG. 3B, the memory cell strings (e.g., eight memory cell strings) that include eight respective memory cells 213 in memory cell sets $246_A$ and $246_B$ can be selected to concurrently retrieve information from those eight memory cells 213. In this example, lines 370, 371, 372, and 373 (e.g., top data lines) can be used to retrieve information from four memory cells 213 in memory cell set $246_A$ while lines 374, 375, 376, and 377 (e.g., bottom data lines) can be to retrieve information from four memory cells 213 in memory cell set $246_B$.

Figure 4A:
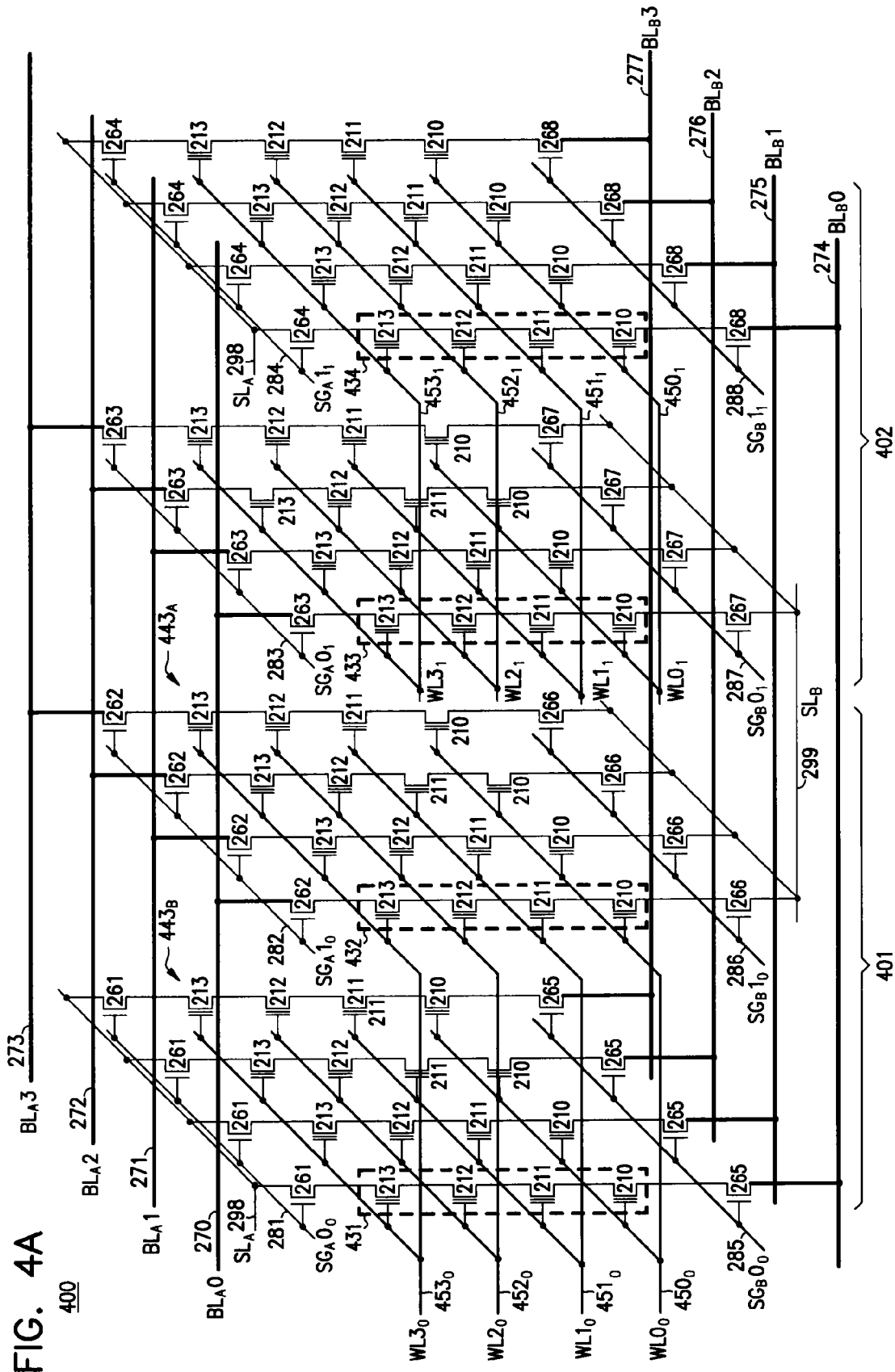
FIG. 4A shows a schematic diagram of a portion of a memory device having data lines and multiple memory groups, according to an embodiment of the invention.

FIG. 4A shows a schematic diagram of a portion of a memory device 400 having lines 270 through 277 and memory groups 401 and 402, according to an embodiment of the invention. Memory device 400 includes elements that can be similar to or identical to those of memory device 200 of FIG. 2A, including memory cells 210, 211, 212, and 213, lines 270 through 277, transistors 261 through 268, lines 281 through 288, and lines 298 and 299. For simplicity, detailed description and operations of similar or the identical elements between FIG. 2A and FIG. 4A is not repeated in the description of FIG. 4A.

Memory cells 210, 211, 212, and 213 in memory device 400 can be arranged into two memory cell groups 401 and 402. Only one of memory cell groups 401 and 402 can be selected at a time during a read or write operation while the other one can be an unselected memory cell group.

Memory device 400 can include lines (e.g., access lines) similar to or identical to those of memory device 200 (FIG. 2A), including lines $450_0$, $451_0$, $452_0$, and $453_0$ associated with memory cell group 401, and lines $450_0$, $451_1$, $452_1$, and $453_1$ associated with memory cell group 402. These lines can carry corresponding signals, such as $WL0_0$, $WL1_0$, $WL2_0$, and $WL3_0$, $WL0_1$, $WL1_1$, $WL2_1$, and $WL3_1$. Signals $WL0_0$, $WL1_0$, $WL2_0$, and $WL3_0$ can correspond to signals, WL0, WL1, WL2, and WL3, respectively, of FIG. 2A. Signals $WL0_1$, $WL1_1$, $WL2_1$, and $WL3_1$ in FIG. 4A can correspond to signals, WL0, WL1, WL2, and WL3, respectively, of FIG. 2A.

FIG. 4A shows two memory cell groups (e.g., 401 and 402) and four access lines in each memory cell group as an example. The number of such memory cell groups and lines can vary.

Line 298 (associated with signal $SL_A$) of memory device 400 can be coupled to transistors 261 and 264. Line 299 (associated with signal $SL_B$) of memory device 400 can be coupled to transistors 266 and 267.

Lines 281, 282, 283, and 284 of memory device 400 can carry signals $SG_A0_0$, $SG_A1_0$, $SG_A0_1$, $SG_A1_1$, respectively. Lines 285, 286, 287, and 288 of memory device 400 can carry signals $SG_B0_0$, $SG_B1_0$, $SG_B0_1$, $SG_B1_1$, respectively.

Transistors 261, 262, 263, and 264 can be controlled (e.g., turned on or turned off) by signals $SG_A0_0$, $SG_A1_0$, $SG_A0_1$, $SG_A1_1$ (e.g., top select gate signals), respectively. Transistors 265, 266, 267, and 268 can be controlled (e.g., turned on or turned off) by $SG_B0_0$, $SG_B1_0$, $SG_B0_1$, $SG_B1_1$ signals (e.g., bottom select gate signals), respectively.

Memory cells 210, 211, 212, and 213 can be arranged in memory cell strings, such as memory cell strings 431, 432, 433, and 434. For simplicity, in FIG. 4A, only two out of eight memory cell strings in each of memory cell groups 401 and 402 are labeled. FIG. 4A shows an example of eight memory cell strings in each of memory cell groups 401 and 402. The number of such memory cell strings in each memory cell group can vary.

Memory cells 210, 211, 212, and 213 in each of memory cell groups 401 and 402 can be arranged in memory cell sets, such as memory cell sets $443_A$ and $443_B$ in memory cell group 401.

For simplicity, the following description describes arrangements of elements and operations associated with memory cell group 401. Memory cell group 402 can include similar or identical arrangements and operations.

As shown in FIG. 4A through FIG. 4E, memory cells 210, 211, 212, and 213 can be arranged in memory cells sets in respective rows. For example, in FIG. 4B, memory cells 210 can be arranged in two memory cell sets $440_A$ and $440_E$ in two rows $490_A$ and $490_B$, respectively. Memory cell sets $440_A$ and $440_E$ can share (e.g., directly coupled to) the same line $450_0$.

In FIG. 4C, memory cells 211 can be arranged in two memory cell sets $441_A$ and $441_B$ in two rows $491_A$ and $491_B$, respectively. Memory cell sets $441_A$ and $441_B$ can share (e.g., directly coupled to) the same line $451_0$.

In FIG. 4D, memory cells 212 can be arranged in two memory cell sets $442_A$ and $442_B$ in two rows $492_A$ and $492_B$, respectively. Memory cell sets $442_A$ and $442_B$ can share (e.g., directly coupled to) the same line $452_0$.

In FIG. 4E, memory cells 213 can be arranged in two memory cell sets $443_A$ and $443_B$ in two rows $493_A$ and $493_B$, respectively. Memory cell sets $443_A$ and $443_B$ can share (e.g., directly coupled to) the same line $453_0$.

FIG. 4A shows an example of memory cell group 401 having 32 memory cells arranged in 8 memory cell sets (also shown in FIG. 4B through FIG. 4E) where each of the memory sets can include four memory cells. The number of memory cell sets and the number of memory cells in each memory cell set (or, for that matter, the number of cells in any other grouping, such as memory cell strings) can vary.

Similarly to the memory cell sets described above with reference to FIG. 2A through FIG. 2E, the memory cell sets in memory device 400 in FIG. 4A can be configured such that memory device 400 can select multiple (e.g., two) memory cell sets in different rows sharing the same access line and concurrently store information into the selected memory cell sets or concurrently retrieve information from the selected memory cell sets.

For example, in FIG. 4A (also FIG. 4E), memory cell sets $443_A$, and $443_B$ (in respective rows $493_A$ and $493_B$) can be selected to concurrently store information into them (e.g., in a write operation) or concurrently retrieve information from them (e.g., in a read operation).

Table 2 shows example values for the signals of memory device 400 in FIG. 4A where memory cell sets $443_A$ and $443_B$ are selected in read and write operations and all of the memory cell sets in memory cell group 401 are selected in an erase operation.

TABLE 2

| | Read memory cell sets $443_A$ and $443_B$ are selected | Write memory cell sets $443_A$ and $443_B$ are selected | Erase memory cell group 401 (all memory cell sets in group 401) |
|---|---|---|---|
| $BL_A0$ | Vbl | V1 | float |
| $BL_A1$ | Vbl | V2 | float |
| $BL_A2$ | Vbl | V3 | float |
| $BL_A2$ | Vbl | V4 | float |
| $BL_B0$ | Vbl | V5 | float |

TABLE 2-continued

| | Read memory cell sets $443_A$ and $443_B$ are selected | Write memory cell sets $443_A$ and $443_B$ are selected | Erase memory cell group 401 (all memory cell sets in group 401) |
|---|---|---|---|
| $BL_B1$ | Vbl | V6 | float |
| $BL_B2$ | Vbl | V7 | float |
| $BL_B3$ | Vbl | V8 | float |
| $WL3_0$ | Vread | Vpgm | 0 |
| $WL2_0$ | Vpass | Vpass | 0 |
| $WL1_0$ | Vpass | Vpass | 0 |
| $WL0_0$ | Vpass | Vpass | 0 |
| $SG_A0_0$ | Vsg_on1 | 0 (or float) | Verase |
| $SG_A1_0$ | Vsg_on1 | Vsg_on2 | Verase |
| $SG_B0_0$ | Vsg_on1 | Vsg_on2 | Verase |
| $SG_B1_0$ | Vsg_on1 | 0 (or float) | Verase |
| $SL_A$ | 0 | 0 | Verase |
| $SL_B$ | 0 | 0 | Verase |

The values of voltages in the read, write, and erase columns in Table 2 can be the same as those in Table 1. In the above example, memory cell group 402 (FIG. 4A) is an unselected memory cell group. Thus, the values of any unique signals in memory cell group 402 (e.g., $WL3_1$) can be deactivated.

Memory device 400 can have a throughput (e.g., programming throughput) R defined an expression R=T/B, where B represents a quantity of bits (e.g., a page) of information to be stored (e.g., program) into the memory cells of memory device 400. T represents an amount of time it takes to store the entire quantity of bits (B) of information. For example, if it takes 40 μs (T=40 μs) to store eight bits (B=8) of information into the memory cells of memory device 400, then the throughput of memory device is R=40 microseconds/8 bits=5 microseconds/bit.

Figure 5A:
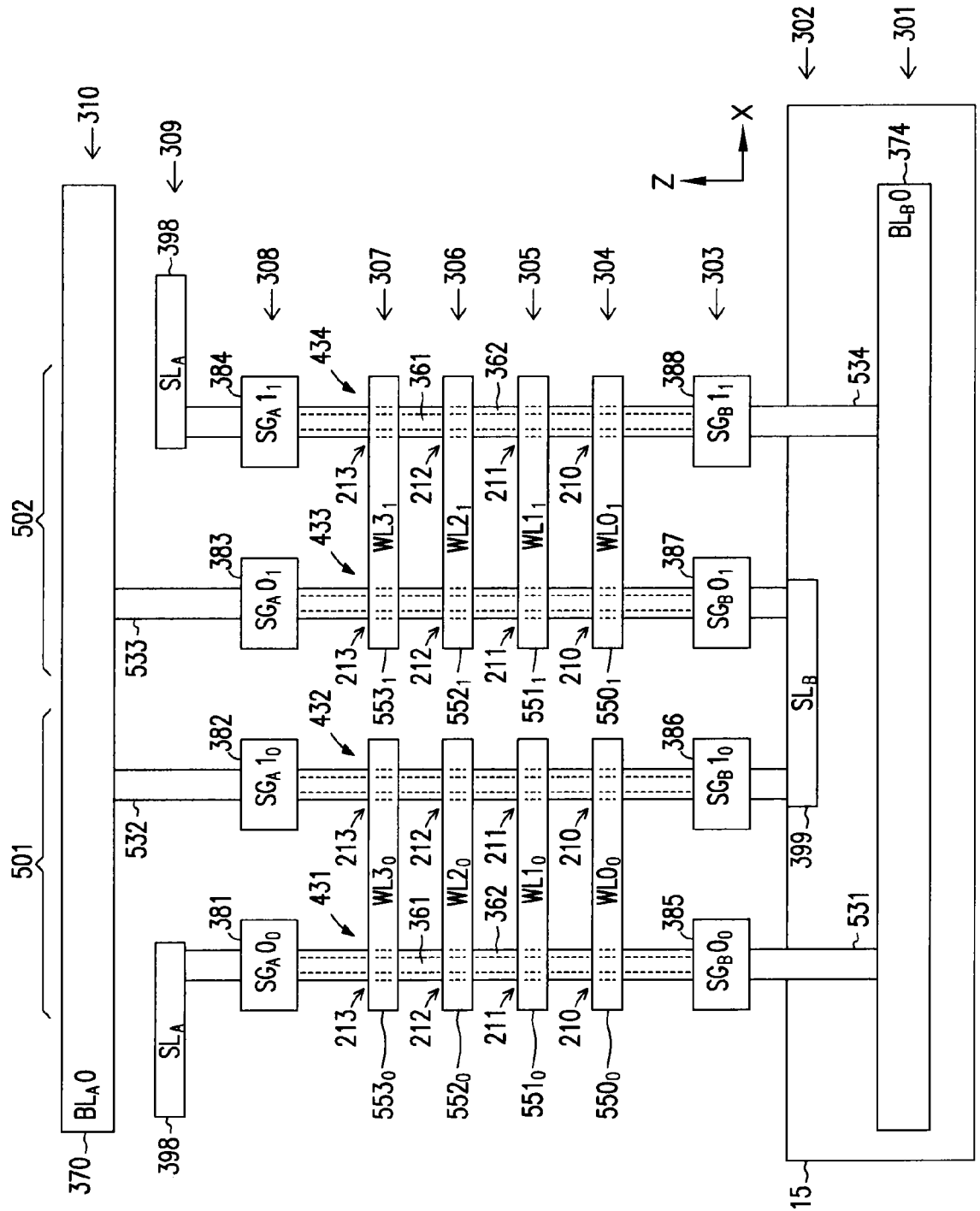
FIG. 5A shows a side view of a portion of a structure of a memory device including multiple memory cell groups, according to an embodiment of the invention.
Figure 5B:
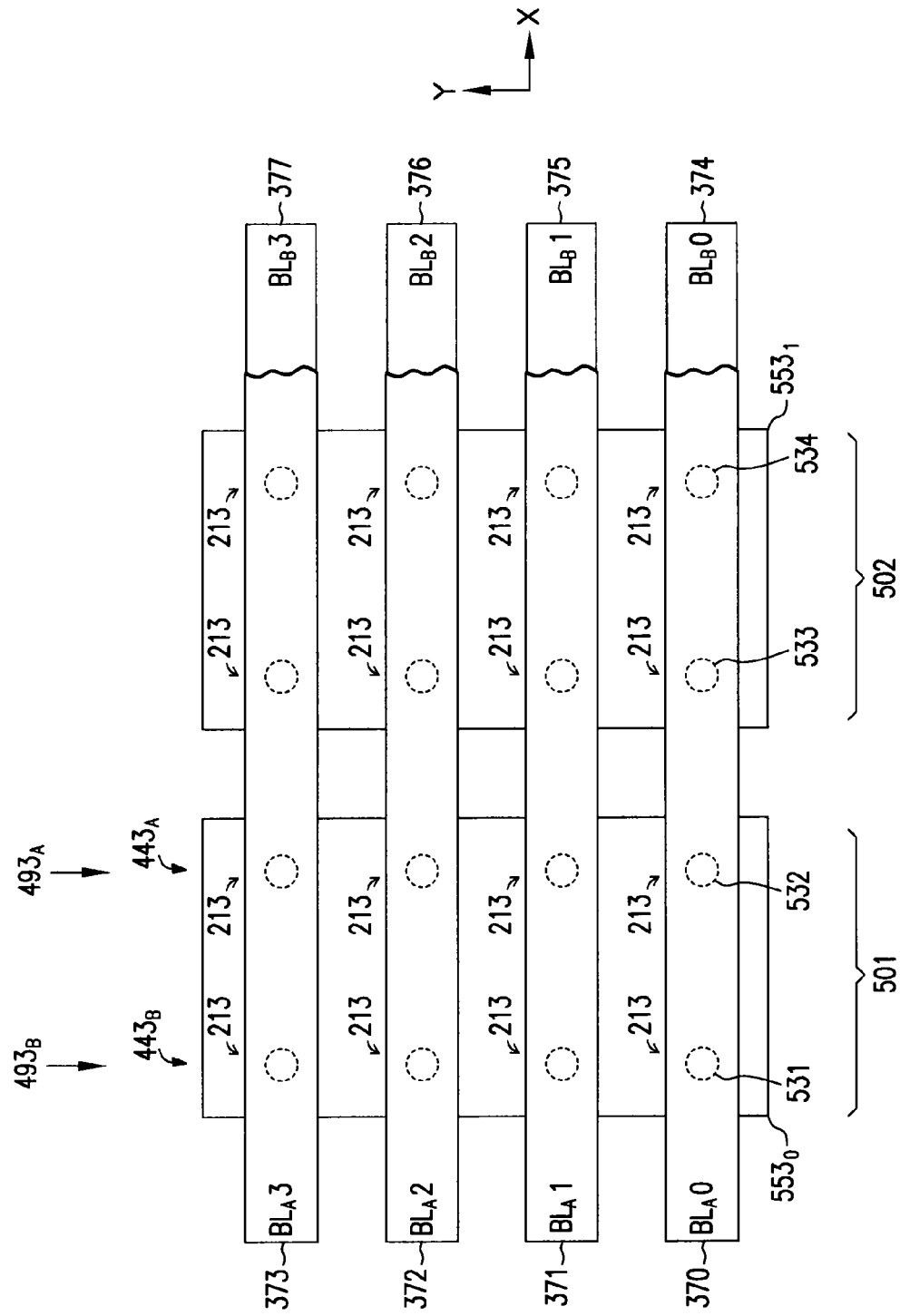
FIG. 5B shows a top view of the structure of the memory device of FIG. 5A, according to an embodiment of the invention.

FIG. 5A shows a side view of a portion of a structure of a memory device 500, according to an embodiment of the invention. FIG. 5B shows a top view of the structure of memory device 500 of FIG. 5A. Memory device 400 of FIG. 4A can include a structure similar to or identical to the structure of memory device 500 of FIG. 5A and FIG. 5B. Memory device 500 and memory device 300 (FIG. 3A and FIG. 3B) can include similar elements. For simplicity, detailed description and functions of similar or the same elements among FIG. 3A, FIG. 3B, FIG. 4A, FIG. 5A and FIG. 5B is not repeated in the description of FIG. 5A and FIG. 5B.

As shown in FIG. 5A and FIG. 5B, memory device 500 can include memory cell groups 501 and 502 that can correspond to memory cell groups 401 and 402, respectively, of FIG. 4A. Memory cell group 501 can include lines $550_0$, $551_0$, $552_0$, and $553_0$ that can correspond to lines $450_0$, $451_0$, $452_0$, and $453_0$ of FIG. 4A. Memory cell group 502 can include lines $550_1$, $551_1$, $552_1$, and $553_1$ that can correspond to lines $450_1$, $451_1$, $452_1$, and $453_1$ of FIG. 4A. Memory device 500 can include contacts 531, 532, 533, and 534 coupled between respected memory cell strings (e.g., 431, 433, 433, and 434) and lines 370 through 377.

As shown in FIG. 5B, memory cell 213 (located on level 307 in FIG. 5A) can be arranged in two memory cell sets $443_A$ and $443_B$ in two rows $493_A$ and $493_B$, respectively. Memory cell sets $443_A$ and $443_B$ can share (e.g., directly coupled to) the same line $553_0$.

Memory device 500 can include memory operations (e.g., read, write, and erase operations) similar to those of memory device 400 described above with reference to FIG. 4A through FIG. 4E. For example, in a memory operation of memory device 500 in FIG. 5B, the memory cell strings (e.g., eight memory cell strings) that include eight memory cells 213 in memory cell sets $443_A$ and $443_B$ can be selected to concurrently store information into those memory cells 213 (e.g., in a write operation) or concurrently retrieve information from those memory cells 213 (e.g., in a read operation). Lines 370, 371, 372, and 373 (e.g., top data lines) can be used to provide information to and from memory cell set $443_A$ while lines 374, 375, 376, and 377 (e.g., bottom data lines) can be used to provide information to and from memory cell set $443_B$.

The illustrations of apparatuses (e.g., memory devices 100, 200, 300, 400, and 500) and methods (e.g., operations associated with memory devices 100, 200, 300, 400, and 500) are intended to provide a general understanding of the structure of various embodiments and are not intended to provide a complete description of all the elements and features of apparatuses that might make use of the structures described herein. An apparatus herein refers to, for example, either a device (e.g., memory devices 100, 200, 300, 400, and 500) or a system (e.g., a computer, a cellular phone, or other electronic system) that includes a device such as memory devices 100, 200, 300, 400, and 500.

Any of the components described above with reference to FIG. 1 through FIG. 5B can be implemented in a number of ways, including simulation via software. Thus, apparatuses (e.g., memory devices 100, 200, 300, 400, and 500 or part of their components, such as control circuit 116 and/or row and column access circuitry 108 and 109) described above may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 300, 400, and 500 may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

The embodiments described above with reference to FIG. 1 through FIG. 5B include apparatuses and methods having a first set of data lines, a second set of data lines, and memory cells located in different levels of the apparatus. In at least one of such embodiments, the memory cells can be arranged in memory cell strings between the first and second sets of data lines. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a first data line located on a first level of the apparatus;
   a second data line located on a second level of the apparatus;
   a first memory cell string coupled to the first data line;
   a first source coupled to the first memory cell string;
   a second memory cell string coupled to the second data line; and
   a second source coupled to the second memory cell string, wherein the first and second sources are located in different levels of the apparatus.

2. The apparatus of claim 1, wherein the first source includes a source line located in a level between the first and second level of the apparatus.

3. The apparatus of claim 1, wherein the second source includes a source line located in a level between the first and second levels of the apparatus.

4. The apparatus of claim 1, further comprising an access line shared by a memory cell of the first memory cell string a second memory cell of the second memory cell string.

5. The apparatus of claim 4, further comprising a module configured to concurrently retrieve information from the first and second memory cells during an operation of the apparatus.

6. The apparatus of claim 4, further comprising a module configured to concurrently store information in the first and second memory cells during an operation of the apparatus.

7. The apparatus of claim 1, wherein the apparatus comprises a memory device.

8. The apparatus of claim 1, wherein the apparatus comprises a system including a memory device that includes the first and second date lines, the first and second memory cells, and the first and second sources.

9. An apparatus comprising:
   a first set of conductive lines, at least a portion of the first set of conductive lines configured as a first set of data lines;
   a second set of conductive lines, at least a portion of the second set of conductive lines configured as a second set of data lines;
   memory cells located in different levels of the apparatus and arranged in memory cell strings between the first and second sets of data lines;
   a first transistor coupled between a first memory string of the memory cell strings and a first data line of the first set of data lines;
   a first select line to provide a signal to control the first transistor;
   a second transistor coupled between a second memory cell string of the memory cell strings and a second data line of the second set of data lines;
   a second select line to provide a signal to control the second transistor; and
   a module configured to concurrently retrieve information from a memory cell of the first memory cell string and a memory cell of the second memory cell string during an operation of the apparatus.

10. The apparatus of claim 9, wherein the module is configured to concurrently store information in the memory cell of the first memory cell string and the memory cell of the second memory cell string during an additional operation of the apparatus.

11. The apparatus of claim 9, further comprising a first source line and a second source line, wherein a first portion of the memory cell strings is coupled to the first source line and the first set of data lines, and a second portion of the memory cell strings is coupled to the second source line and the second set of data lines.

12. The apparatus of claim 11, wherein the first source line is located between the first portion of the memory cell strings and the second set of data lines.

13. The apparatus of claim 12, wherein the second source line is located between the second portion of the memory cell strings and the first set of data lines.

14. The apparatus of claim 9, further including a substrate, wherein one of the first and second sets of data lines is located between the substrate and the memory cells.

15. An apparatus comprising:
    memory cells arranged in rows including a first row and a second row, the memory cells including a first memory cell set located in the first row and a second memory cell set located in the second row;
    a first set of conductive lines, at least a portion of the first set of conductive lines configured as a first set of data lines;
    a second set of conductive lines, at least a portion of the second set of conductive lines configured as a second set of data lines; and
    a module configured to concurrently retrieve information from the first and second memory cell sets through the first and second sets of data lines in an operation of the apparatus.

16. The apparatus of claim 15, wherein the module is configured to concurrently store information in the first and second memory cell sets through the first and second sets of data lines in an additional operation of the apparatus.

17. The apparatus of claim 15, further comprising an access line shared by the first and second memory cell sets.

18. The apparatus of claim 15, wherein the memory cells are located in a same level of the apparatus.

19. The apparatus of claim 15, wherein the first and second sets of conductive lines are located in different levels of the apparatus.

20. The apparatus of claim 15, further comprising a source coupled to the first memory cell set and a second source coupled to a second memory cell set, wherein the first and second sources are located in different levels of the apparatus.

21. The apparatus of claim 15, wherein the first and second memory cell sets include an equal quantity of memory cells.

* * * * *